United States Patent [19]
Kurtze et al.

[11] Patent Number: 5,022,004
[45] Date of Patent: Jun. 4, 1991

[54] METHOD AND APPARATUS FOR DRAM MEMORY PERFORMANCE ENHANCEMENT

[75] Inventors: Jeffrey D. Kurtze, Nashua, N.H.; James Turner, Chelmsford, Mass.

[73] Assignee: Apollo Computer, Inc., Chelmsford, Mass.

[21] Appl. No.: 264,270

[22] Filed: Oct. 28, 1988

[51] Int. Cl.⁵ .................................................. G11C 7/00
[52] U.S. Cl. ................................. 365/189.07; 365/195
[58] Field of Search ................... 365/189.01, 189.07, 365/195

[56] References Cited

U.S. PATENT DOCUMENTS

| | | | |
|---|---|---|---|
| 4,104,719 | 8/1978 | Chu et al. ................... | 365/230.05 |
| 4,599,708 | 7/1986 | Schuster ...................... | 365/189.07 |
| 4,744,062 | 5/1988 | Nakamura et al. .......... | 365/189.07 |
| 4,931,993 | 6/1990 | Urushima .................... | 365/189.01 |

Primary Examiner—James W. Moffitt
Attorney, Agent, or Firm—Weingarten, Schurgin, Gagnebin & Hayes

[57] ABSTRACT

A method and apparatus is disclosed for improving the performance of a digital computer by reducing the latency of read operations and increasing available write bandwidth by utilizing a subset of the address bits which are the same from one operation to the next. A faster cycle type (e.g. page mode or static column) can thereby be employed in the Dynamic Random Access Memory (DRAM) memory by eliminating the DRAM precharge and RAS address portions of the cycle.

9 Claims, 2 Drawing Sheets

METHOD AND APPARATUS FOR DRAM MEMORY PERFORMANCE ENHANCEMENT

FIELD OF THE INVENTION

The present invention relates to computer memory systems, and in particular to cache memory systems.

BACKGROUND OF THE INVENTION

High speed computer memories, in particular cache memory performance is strongly influenced by the amount of time necessary to fill the cache memory with new data required by the processor. The sooner such a read operation can be started in main memory, the less time it will take to fill the cache. The influence of read latency on performance is derived from the read latency times the cache miss rate. This is the amount of time by which an average processor cycle will be increased due to cache read latency.

SUMMARY OF THE INVENTION

The method and apparatus according to the present invention starts a read operation before a previously issued write operation, except that a read operation need only wait for write operations to complete if they have an impact on the data to be obtained by the read operation. Therefore a read may be promoted ahead of any write operation which does not conflict.

The opportunity for promoting reads over writes occurs anywhere writes are buffered. In these places the read operation address range is compared to older write operations stored in the buffer or queue. If the addresses do not overlap, then the write can have no effect on the result of the read and the read is promoted and issued first. If the addresses do overlap, then the read waits for the write to be issued. The address comparison may be done sequentially by stepping through the queued write commands, as in this implementation, or it may be done in parallel by replicating the address comparison logic.

In a read cycle, the cycles for a typical static column DRAM are: (1) Row Address applied, (2) Row Address Strobe asserted, (3) Column Address applied, (4) Column Strobe asserted, (5) Strobes deasserted for a precharge time. If the Row address is the same from one operation to the next, then phase 5 of the current cycle and phases 1 and 2 of the next cycle (and 4 for static column devices) may be omitted thereby decreasing the amount of time required for the next cycle. Identical savings may be made with write cycles. Address comparison logic is used to determine if the bits which select the set of DRAMs to be used and the Row Address Strobe address bits are the same. This ability to use a shorter cycle increases memory performance and reduces the amount of time it takes to clear writes from the command queues and also reduces the latency on read operations.

BRIEF DESCRIPTION OF THE DRAWINGS

These and other features of the present invention are better understood by reading the following detailed description of the invention, taken together with the drawings, wherein.

Further details of one embodiment of a memory system is shown in copending application U.S. patent application Ser. No. 07/263,112 A FLOATING POINT PIPELINE PROCESSOR, filed Oct. 26, 1988, incorporated by reference, and U.S. patent application Ser. No. 07/264,058, entitled AN EFFICIENT CACHE WRITE TECHNIQUE THROUGH DEFERRED TAG MODIFICATION, filed concurrently herewith and incorporated by reference.

DETAILED DESCRIPTION OF THE INVENTION

The following memory device read or write steps, cycles, states, signals and associated hardware, individually, and in the prior art combination, are known to those of ordinary skill in the art and further defined in product specifications and application notes provided for exemplary DRAMS 256kx4 100 ns static columns DRAM manufactured by Toshiba TC514258J-10, Mitsubishi M5M44C258J-10, Hitachi HM514258JP-10 and FUJITSU MB81C4258-10PJ.

Figure 1:
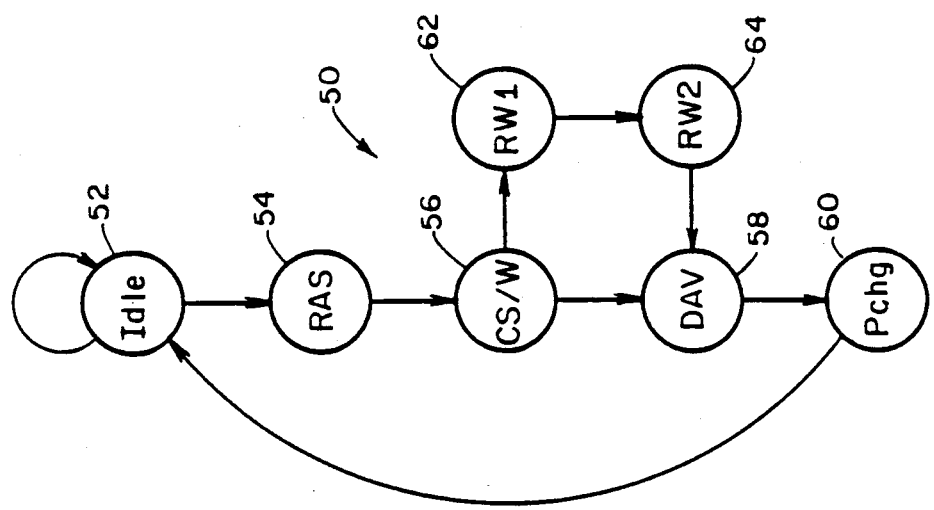
FIG. 1 is a prior art DRAM control state diagrams.

In the prior DRAM cycle illustrated in the state diagram 50 of FIG. 1. When a standard cycle starts (from Idle, 52), the DRAM row address portion of the command is driven on the DRAM address lines and the DRAM control lines, Row Address Select (RAS) Chip Select (CS) and write W are deasserted. The RAS control line is asserted in state RAS 54, then, in state CS/W the columns address is driven on the DRAM address lines and either CS (for a read cycle) or CS and W (for a write cycle) is asserted. The normal progress is then to state data available 58 (DAV) to latch in the data on a read cycle, or to assert CS to perform a write cycle. The cycle then completes by proceeding to state Pchg, 60 which deasserts all control lines and then to Idle 52.

Figure 2:
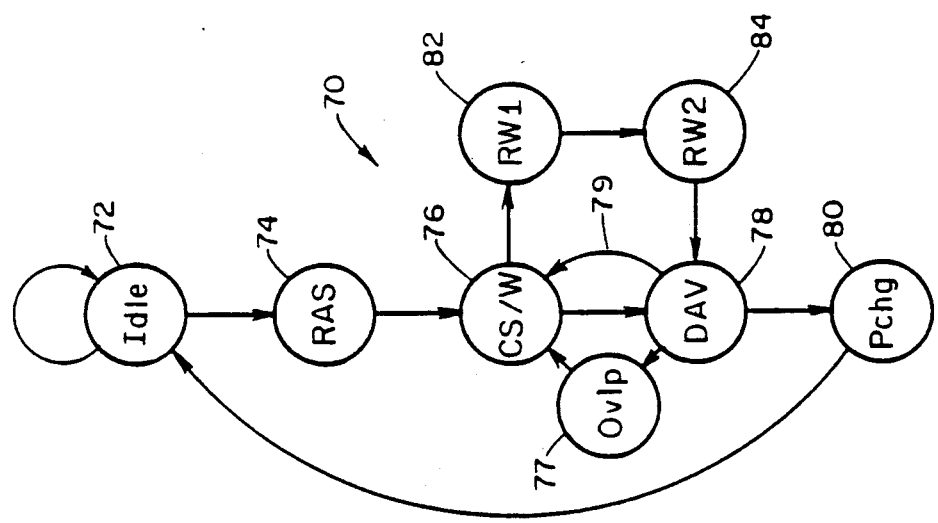
FIG. 2 is a DRAM control state diagram according to one embodiment of the present invention.
Figure 3:
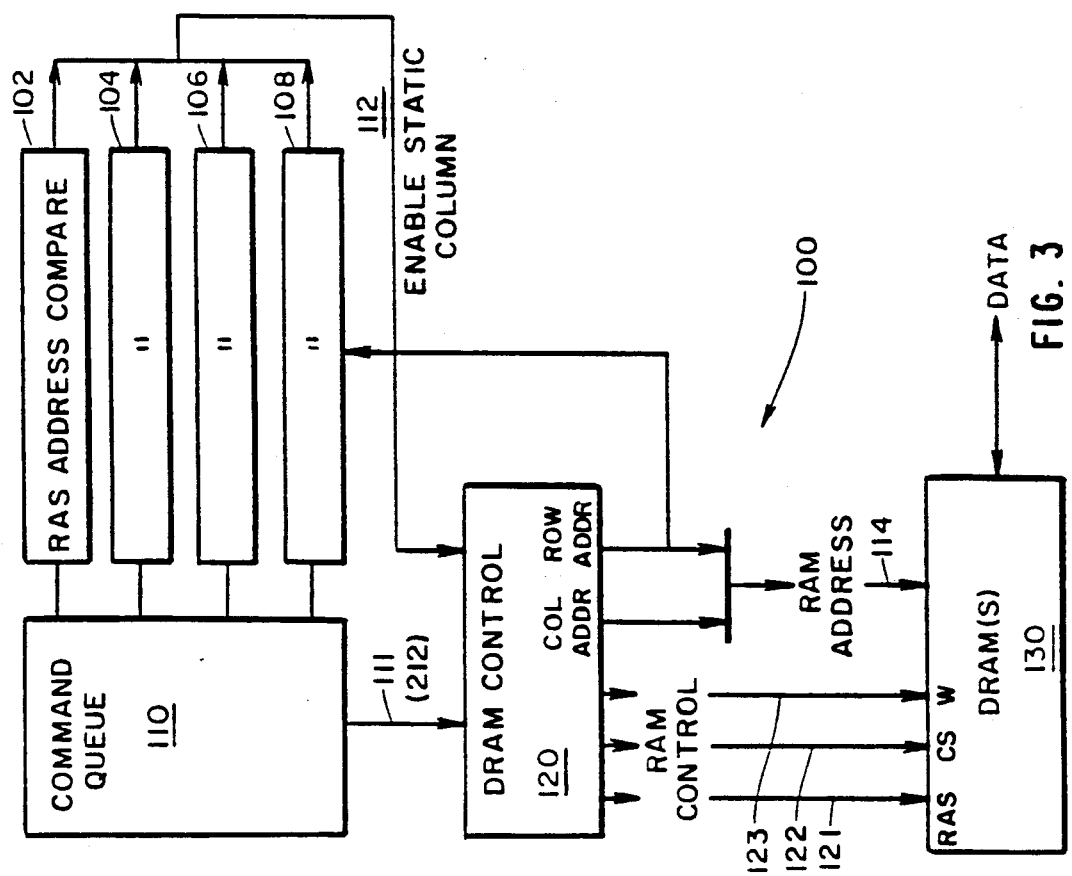
FIG. 3 is a block diagram of one embodiment of a DRAM address and control unit according to the present invention.

By contrast, the operation of the DRAM according to the present invention is illustrated in the state drawing 70, FIG. 2 and associate control 100 of FIG. 3. The operation of states 72, 74 and 76 correspond to states 52, 54 and 56 of FIG. 1. If, in DAV 78, we recognize the RAS address for the current cycle is the same as the RAS address for the next command to be executed, then we can branch back to CS/W 76 either directly or through state Ovlp 77. In the state Ovlp 77, both W, 123 and CS, 122 control signals are deasserted to avoid unintended write operations to the DRAM(s) 130. Ovlp 77 may be used all the time if the timing requirements of the DRAM cannot be met otherwise, but is always required when the current cycle is a read and the next cycle is a write so that there is no possible overlap between the assertion of CS for the previous cycle and W for the next cycle. The transition from state DAV 78 to CS/W 76 eliminates either two or three (depending on whether Ovlp is used) of the five states required for the standard cycle.

Similar savings accrue for a read-modify-write cycle The standard (prior art) cycle performs a read cycle as described above passing through states Idle 52, RAS 54, CS/W 56 and RW1 62. Then the data read is modified and written to the same address in states RW2 64 and DAV 58. The cycle then completes by passing through Pcgh 60 and returning to Idle 52.

By contrast, the present invention provides that if, in state DAV 78, (having arrived through states 72, 74, 76, 82 and 84 analogized to previously described in reference to states 52, 54, 56, 62 and 64), the RAS address of the next command and the RAS address of the current cycle are equal, then the state machine passes to CS/W either through Ovlp 77 or directly 79. Therefore, the system and method of the present invention saves two or three (72, 74 and 80) of the seven cycles required by the standard cycle 50 of FIG. 1.

The memory structure 100 of FIG. 3 provided commands for DRAM operations (read, write, read-modify-write) which are entered into the command queue (110). At each cycle, the command progresses through the queue if the next adjacent entry is empty. At each level a comparison is done in parallel (102, 104, 106, 108) between the RAS address field of each entry in the queue and the RAS address of the current cycle being executed by the DRAM control (120). The comparator output associated with the next command to be executed by the DRAM control is selected (112) and presented to the DRAM control to affect the flow of its state machine. The DRAM control presents RAS, CS and W control signals 121, 122 and 123 and a multiplexed RAS/CS address on leads 114 to the DRAM array (130) to control its operation according to the state shown in diagram 70 of FIG. 2.

Figure 4:
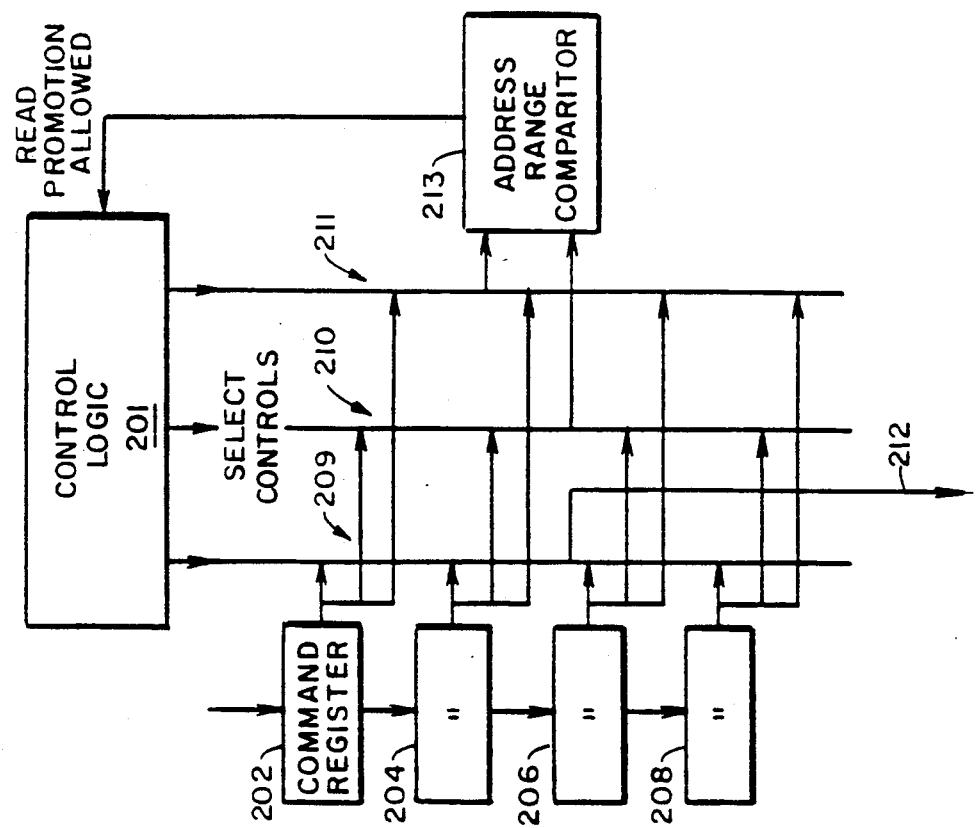
FIG. 4 is a block diagram providing further detail of the command and address range elements showing sequential address comparisons.

An embodiment of the control logic shown in FIG. 4 selects the next read command to be executed using multiplexer 210 and sequences through all older write commands in the queue using multiplexer 211 comparing the address ranges using comparitor 212. If any older write conflicts in address, then the control logic waits until that write command is being executed to promote the read to be the next operation to be executed. Otherwise the read command is promoted immediately and presented to the DRAM control logic via multiplexer 209 when the current command being executed (if any) is no longer needed by the DRAM control.

Moreover, the present invention permits the merging of the data from the read operation of the memory with data which is to be updated by the pending write commands in order to allow promotion of reads over write operations which do conflict in address.

Furthermore, the present invention when implemented can provide a sequence of commands to a processor permitting out-of-order execution of commands (including writes) in the main memory, optimized using these shorter cycles. For example, in the case of two operations which share a RAD address and are separated by other operation(s), the second operation could be executed out of order.

APPENDIX I

AT Memory Subsystem Functional Description and Specification

Table of Contents

1. Memory Subsystem Summary .................... 11
   1.1  Overview
   1.1.1 Features 2. Memory Subsystem Partitioning .................... 12
   2.1  Memory Module Controller (MMC)
   2.1.1 Power Up and Reset
   2.1.2 Module Controller Pin Description
   2.2  Memory Modules
   2.2.1 Daughterboard Connector and Pinout
   2.2.2 Allowable Memory Configurations 2.3 Memory Bank Controller (MBC)
2.3.1 Burst Mode Operation
2.3.2 Scan Mode
2.3.3 MBC Pin Description

3. Memory Control Logic Operation ...... 21
3.1 Bus Commands
3.1.1 Invalid Commands
3.1.2 XBUS Write Command
3.1.3 XBUS Write Multiple Command
3.1.4 XBUS Write Data Command
3.1.5 XBUS Read and Read Multiple Commands

4. Memory Performance ...... 23
4.1 Read Multiple
4.1.1 Latency
4.1.2 Bandwidth
4.2 Write Multiple
4.2.1 Latency
4.2.2 Bandwidth
4.3 Read Single
4.3.1 Latency
4.3.2 Bandwidth
4.4 Write Single
4.4.1 Latency
4.4.2 Bandwidth

5. Control and Status Registers ...... 25
5.1 MMC Control and Status Registers
5.1.1 Interrupt Address Register
5.1.2 Control and Status Register
5.1.3 Interrupt Service
5.2 MBC Control and Status Registers
5.2.1 Bank Controller Control and Status Register
5.2.2 Error Address Register

6. Error Handling ...... 29
6.1 Correctable Errors
6.2 Uncorrectable Errors

7. Diagnostic Features ...... 30
7.1 Diagnostic Mode
7.2 Write All Quadrants
7.3 Raw Mode
7.4 Lock Compare Register
7.5 Freeze Check Bits
7.6 Reading the Check Bit RAMs 8. Reliability .................................... 30
   8.1   MOS DRAM MTBF 9. Power ........................................ 31

A. DRAM MTBF Calculations ...................... 32
   A.1   RAM Failure Model
   A.2   Effect of Error Correcting Codes on Soft Error Rate
   A.3   RAM Hard Errors B. ECC Parity Algorithm ........................... 34
   B.1   ECC Parity Matrix
   B.2   256Kx4 DRAM Bit to Device Assignment
   B.2.1 Data Bit Assignment
   B.2.2 Check Bit Assignment

1. Memory Subsystem Summary

1.1 Overview

The main memory subsystem is a modular design capable of implementing 8 to 256MB of ECC RAM on a single board using up to 4 pluggable daughterboard modules of 8, 16, 32 or 64MB each. The DRAMs used are 100ns static column CMOS DRAMs with a 256Kx4 organization for the 8 and 16MB modules and a 1Mx4 organization for the 32 and 64MB modules.

The goal of the design is to support up to 4 CPUs as well as I/O transactions over the high bandwidth XBUS by minimizing traditional bottlenecks associated with the memory. It achieves this goal by using a high degree of parallelism even in the smaller memory configurations and by and intelligence in managing its write buffers and recognizing opportunities for increasing memory bandwidth by using static column cycles.

1.1.1 Features

- Multiple memory boards may be used in a system to implement the required amount of memory. Each board uses only one backplane connector but, with its daughterboards, occupies two slots. Each board responds to unique addresses for register accesses based on the slot ID and to a programmed address range for memory accesses. The only hardware limitations on the number of memory boards is the available number of slots and the 4 bit slot ID.

- Memory is partitioned into modules of 8MB to 64MB (see Figure 1A). Each module is partitioned into 4 interleaved, independently controlled banks of RAM. Each bank has a data width of 32 bits. Module sizes may be mixed arbitrarily without any hardware restriction. However, for diagnostic purposes, it is most efficient to pair modules of the same size.

- Each bank of memory implements an error correcting code (ECC) on each 32 bit data word allowing correction of single bit errors and detection of double bit errors (SEC-DED). No data is read during refresh cycles, so only normal operation exposes ECC errors in the memory. The memory does not rewrite locations with errors automatically, so software must rewrite a location with a soft error to correct the data in the DRAMs.

- Simultaneous single reads or writes are permitted in independent banks of memory even within the same module. Successive commands to the same bank and page (actually RAS address) use static column mode to increase memory bandwidth.

- Higher bandwidth is achieved for XBUS read or write multiple commands using bursts supported by static column RAMs. During a burst two 32 bit data words are delivered (or consumed) in each bus cycle. Bursts are limited to

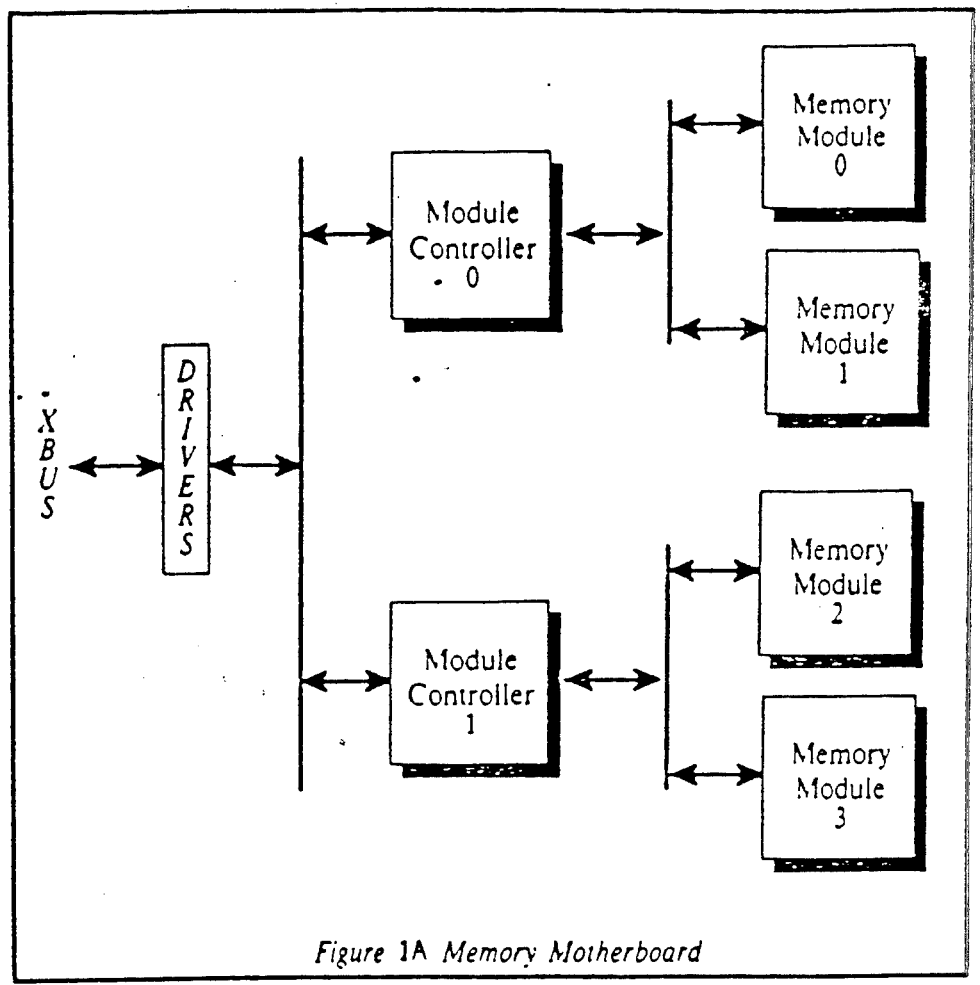

*Figure 1A Memory Motherboard*

1KB and may not cross a page (4KB) boundary. Writes are accepted up to the available queue size if the target module is busy.

- Command queues are included in the module and bank controllers to improve efficient use of the XBUS and the memory. Limited command reordering is used to reduce read latency.

2. Memory Subsystem Partitioning

Memory is partitioned into modules of 8, 16, 32, or 64MB. Each module is physically built on a daughter board. Up to 4 daughterboards may be mounted on each mother board (see Figure 1A). The entire set of installed modules may be configured as a contiguous memory space regardless of what mix of daughterboard sizes are used or which daughterboard sites are populated.

Each daughterboard is partitioned into 4 independent, interleaved banks. There are two Memory Bank Controller (MBC) gate arrays on each daughterboard and so pairs of banks share an MBC.

2.1 Memory Module Controller (MMC)

This section provides an overview of MMC functionality. Additional information on the detailed implementation of the MMC is available in the *MMC Functional Specification and Implementation Description*.

Each motherboard has two MMC gate arrays to handle the XBUS protocol. Each MMC is logically capable of handling all 4 modules, but, for timing considerations, two MMCs are used to split the load. Each MMC (see Figure 2A) contains a small command queue of 4 entries. If the queue is empty and the target MBC's queue can accept it, then the command bypasses the MMC's queue. If, on the other hand, the module controller's queue is not empty or the target bank cannot accept it, then it is queued in the MMC. If the MMC's queue is full, the MMC issues a "busy" acknowledge to the XBUS transaction. In the case of a Write-Multiple command, a "busy" is returned for the initial transaction if the queue is too full to store at least one of the accompanying write data commands. Otherwise it accepts as many write data commands as it can before issuing a "busy". While the MMC has commands

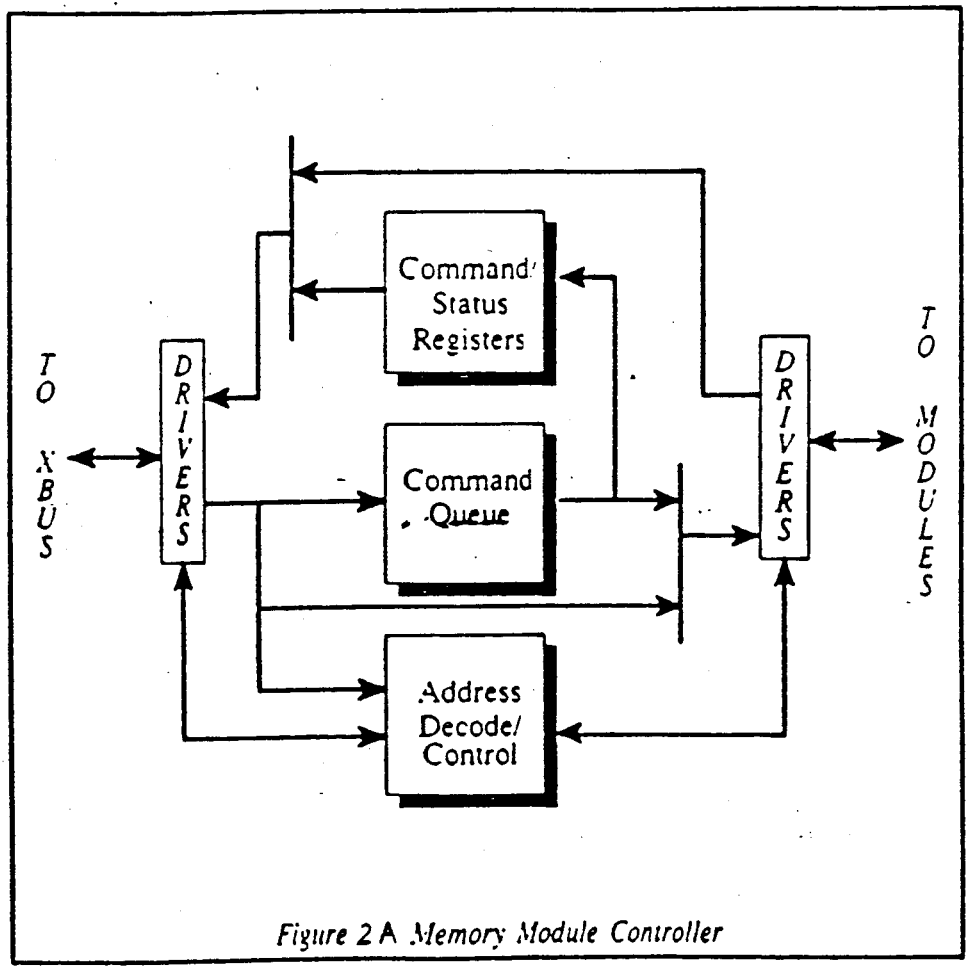

*Figure 2 A Memory Module Controller* queued, it attempts to pass the oldest read command in front of write commands which do not conflict in address. This is intended to reduce the worst case read latency whenever possible.

The module controller performs all XBUS protocol management. It decodes the command and address fields and determines whether a bus command has a destination on the board and, if so, for which bank(s). Scan-path reset initialization connfigures the MMC to respond only to an address derived from its own unique slot ID for CSR register references. Scan-initialized constants also determine the starting address of the attached modules and their sizes in 8MB increments. Multiple modules on a board occupy contiguous memory locations. Any individual module may be disabled by programming its size to be 0.

The module controller monitors the status of each of its MBCs and distributes commands to them when an MBC command queue is not full. This happens simultaneously with receiving commands from the bus, so the queue performs as a FIFO if the target module becomes ready before the queue fills completely.

The MMC also contains control and status registers for board level functions. If a bank controller reports an error, the module controller issues an interrupt to a software programmable address. An ECCC interrupt may be directed to a different address near the address for an ECCU. ECCU errors on reads are indicated on the XBUS with a Read-Response-Error in addition to the interrupt to prevent inadvertent use of corrupt data by the reader.

2.1.1 Power Up and Reset

All power up and reset initialization is performed by the scan-path hardware. During scan-path usage, CS-before-RAS refresh is performed by external hardware to keep the DRAM data alive. This backup refresh logic starts if it is enabled and it detects that the normal clocks have stopped. It is stopped by a signal from the SCR. The scan logic also loads the slot ID and module sizes into the MMCs.

2.1.2 Module Controller Pin Description

The Module Controller is a 13K gate array in a 256 pin PGA package. 249 Pins are actually used.

The Module Controller must connect to a large subset of the XBUS signals which accounts for 91 pins:

| | | | |
|---|---|---|---|
| X_CMD(4:0) | XBUS Command | Bidirectional | 5 |
| X_DAT(63:0) | XBUS Data | Bidirectional | 64 |
| X_DATP(7:0) | XBUS Data Parity | Bidirectional | 8 |
| X_ID(3:0) | XBUS Commander ID | Bidirectional | 4 |
| X_SUBID(1:0) | XBUS Commander SUBID | Bidirectional | 2 |
| X_REJ | XBUS Command Reject | Input | 1 |
| X_ACK-(1:0) | XBUS Acknowledge | Output | 2 |

| | | | |
|---|---|---|---|
| X_BUSREQ | XBUS Bus Request | Output | 1 |
| X_BUSGNT | XBUS Bus Grant | Input | 1 |
| X_INH_ARB_D | XBUS Inhibit Arbitration | Output | 1 |
| X_INH_ARB_R | XBUS Inhibit Arbitration | Input | 1 |
| X_DIS_IN | XBUS Disable Input | Input | 1 |

Driver/Receiver Enables, Error Reporting and Diagnostic Pins account for 4:

| | | | |
|---|---|---|---|
| X_DE- | XBUS Driver Enable | Output | 1 |
| X_RE-.. | XBUS Receiver Enable | Output | 1 |
| CLK_STP- | Stop Clocks | Output | 1 |
| X_DIAG | XBUS Diagnostic Mode | Input | 1 |

Communication between the MMC and the MBC requires 96 signals:

| | | | |
|---|---|---|---|
| B_CMD(2:0) | Bank Command | Output | 3 |
| B_DAT(63:0) | Bank Data | Bidirectional | 64 |
| B_ID(3:0) | Read Response ID | Input | 4 |
| B_SUBID(1:0) | Transaction Subid | Bidirectional | 2 |
| B_REJ | Bank Command Reject | Output | 1 |
| B_BS-(3:0) | Bank Select | Output | 4 |
| B_MS-(3:0) | Module Select | Output | 4 |
| B_RR_GO- | Read Response Go | Output | 1 |
| B_ECCC- | Correctable ECC Error | Input | 1 |
| B_ECCU- | Uncorrectable ECC Error | Input | 1 |
| B_FULL02-(3:0) | Even MBC Queue Full | Input | 4 |
| B_FULL13-(3:0) | Odd MBC Queue Full | Input | 4 |
| RR_REQ-(3:0) | Read Response Request | Input | 4 |
| B_NACK-(3:0) | Cancel Read Response Transfer | Input | 4 |

53 Clock, Scan Control, VCC and ground pins:

| | | | |
|---|---|---|---|
| CLOCKA | clock | Input | 1 |
| CLOCKB | clock | Input | 1 |
| A | Scan Control | Input | 1 |
| B | Scan Control | Input | 1 |
| C | Scan Control | Input | 1 |
| D | Scan Control | Input | 1 |
| DI | Scan Control | Input | 1 |
| DO | Scan Control | Output | 1 |
| E | Scan Control | Input | 1 |
| GND | Ground | Input | 32 |
| VCC | +5 Volt Supply | Input | 12 |

- 15 -

2.2 Memory Modules

Memory size is determined by the number and type of memory modules installed. These modules are implemented as daughter cards which plug onto the motherboard. Up to 4 daughter cards may be installed on each motherboard. Each module (see Figure 3A) incorporates 4 interleaved banks of memory each 32 data bits wide (plus 8 ECC bits for single-error-correct/double-error-detect) and the associated bank controllers. The larger module uses either 80 or 160 DRAMs with either 256Kx4 or 1Mx4 organization depending on module size.

Since 160 DRAMs are required for each 16MB memory module, 20 pin SOJ surface mount packaging is used to increase the packing density of the modules. Double sided mounting is required to meet the density goal.

DRAMs, drivers and two MBC gate arrays are installed on the daughter board to make a completely modular unit. A configuration register readable only by the service processor identifies the DRAM size, module size, and DRAM vendor.

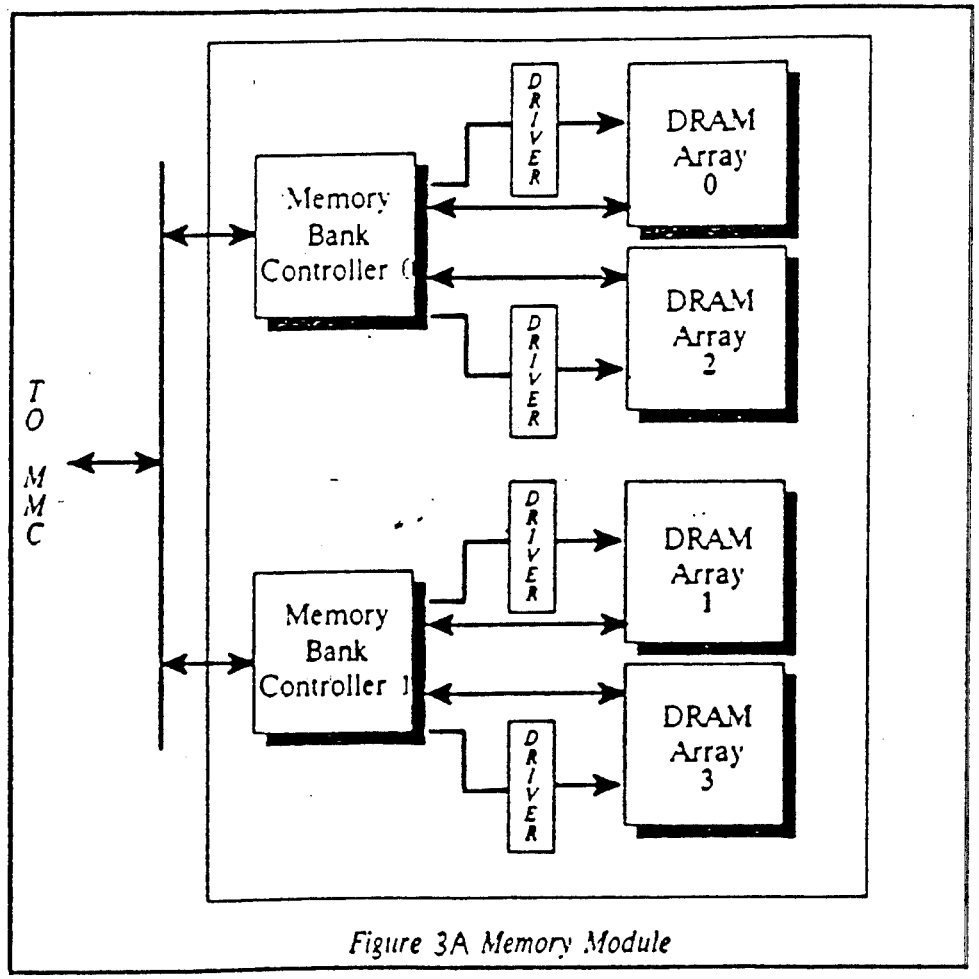

*Figure 3A Memory Module*

2.2.1 Daughterboard Connector and Pinout

The pinout of the daughterboard connector is an image of the pinout of the MBC. MBC pins generally connect to the opposing pin on the connector to reduce the routing congestion on the daughterboard. Bus connections between the MBCs are made on the motherboard.

In order to facilitate routing on the motherboard, a 240 pin, surface mount, compression style connector is used and only contact pads are required on both the motherboard and daughterboard. The daughterboard has contact pads on both sides of the board and mounts with either component side up or solder side up depending on the module location. The motherboard pads can then be directly bussed between the two module locations.

2.2.2 Allowable Memory Configurations

All combinations of module sizes and depopulations are permitted on the motherboard.

2.3 Memory Bank Controller (MBC)

This section provides an overview of MBC functionality. Additional information on the detailed implementation of the MBC is available in the *MBC Functional Specification and Implementation Description*.

Each bank of memory contains every fourth 32 bit data word of the module. Two banks are controlled by each MBC to reduce cost, overall pin count and complexity. Longwords at byte offsets of 0 and 8 are handled by one MBC and longwords at byte offsets 4 and 12 by the other. Error correcting codes are implemented in the bank controller which allow correction of single bit errors and detection of double bit errors. See Appendix B for the parity matrix of the code used. Normally 7 ECC check bits are used for SEC-DED coverage of 32 bits, but in this case it is augmented by one bit because 4-bit wide DRAMs are used. This augmented ECC allows detection of any 3 or 4 bit error that can occur due to a single DRAM failure. The error address register and syndrome are contained in the MBC's CSR space.

The bank controller (see Figure 4A) controls the details of the RAM cycle including RAS, CS, multiplexed address and write enable as well as data path control and application of ECC. CS before RAS refresh is used.

2.3.1 Burst Mode Operation

Static column burst mode is used as required for returning data requested by a Read Multiple command. During burst mode operation, pairs of banks are cycled together. The two banks in each MBC alternate in supplying data. Static column burst mode is also used in each bank independently to consume the data associated with a Write Multiple. Write Multiples may specify ascending or descending addresses to allow for buffer copy and stack write operations. If the Read Multiple transfer size

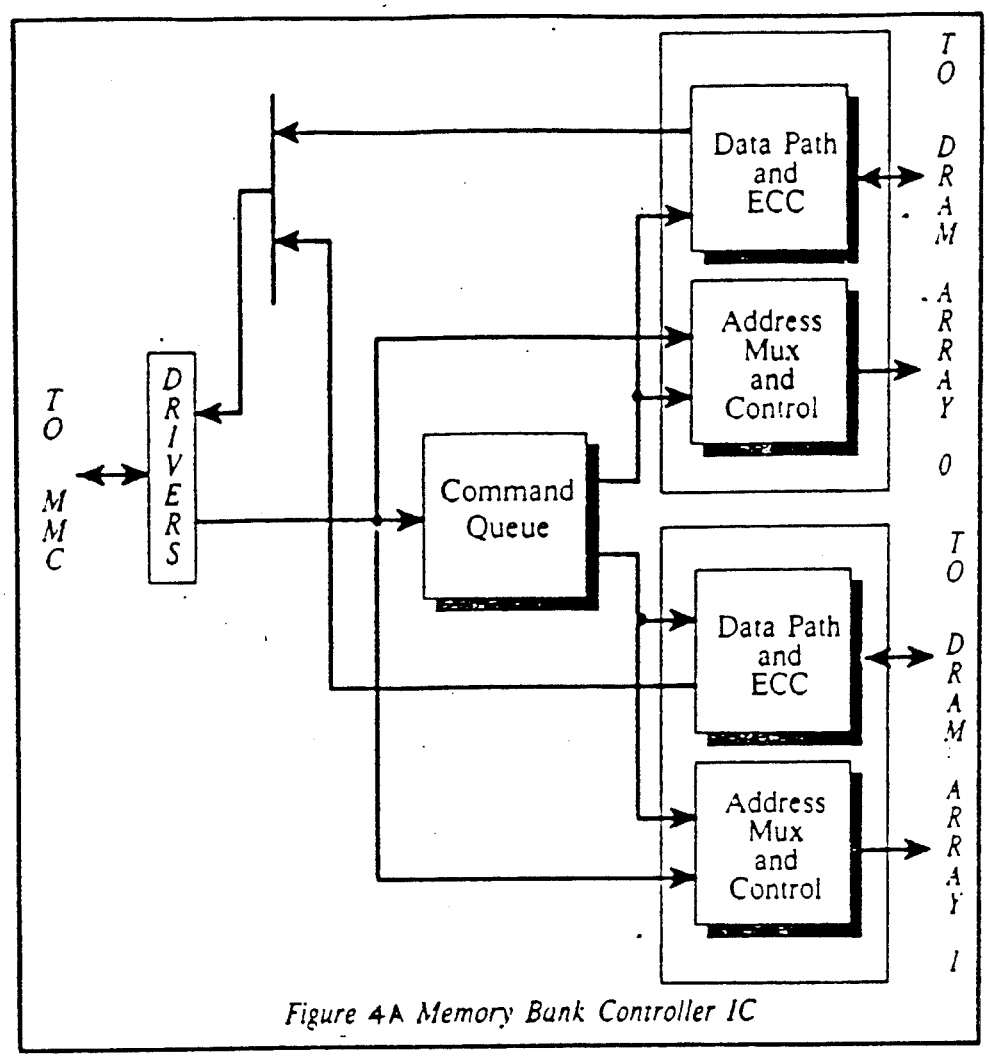

Figure 4A Memory Bank Controller IC is a power of two, it may be specified to start anywhere in the block and, at the end, wrap around modulo the block size. This function supports cache fill operations where the faulting word is required first (or last), as well as natural order cache fills.

The source of a Read command is assumed to be ready for its read response(s). "Busy" and "error" acknowledges from the commander are ignored and no retry of the bus transfer is attempted by the memory.

During a burst, refresh is suppressed and any accumulated refresh requests are processed at the end of the burst. The refresh request interval has a 20% margin built in so that the maximum length burst does not violate the RAM refresh specification.

2.3.2 Scan Mode

Care must be used in entering and leaving scan mode if the contents of the DRAMs is to be preserved. RAS (Row Address Strobe) timing is particularly sensitive. If it is violated, then an entire row of cells may be corrupted in each affected DRAM. When the gate array clocks stop. external refresh circuitry normally takes over and keeps the DRAM data alive. To restart the MBC, the state of the MBC must be scanned out. modified to restart memory DRAM operations in progress, and reloaded.

2.3.3 MBC Pin Description

The MBC gate array is a 30K gate array in a 256 pin PGA. 251 pins are actually used.

Communication between the MMC and the MBC requires 83 signals:

| Signal | Description | Type | Count |
|---|---|---|---|
| B_CMD(2:0) | Bank Command | Input | 3 |
| B_DAT(63:0) | Bank Data | Bidirectional | 64 |
| B_ID(3:0) | Read Response ID | Tristate | 4 |
| B_SUBID(1:0) | Transaction Subid | Bidirectional | 2 |
| B_REJ | Bank Command Reject | Input | 1 |
| B_BS0- | Even Bank Select | Input | 1 |
| B_BS1- | Odd Bank Select | Input | 1 |
| B_MS- | Module Select | Input | 1 |
| B_RR_GO- | Read Response Go | Input | 1 |
| B_ECCC- | Correctable ECC Error | Tristate | 1 |
| B_ECCU- | Uncorrectable ECC Error | Tristate | 1 |
| B_FULL- | MBC Queue Full | Output | 1 |
| RR_REQ- | Read Response Request | Output | 1 |
| B_NACK- | Cancel Read Response Transfer | Tristate | 1 |

Controlling two banks requires 114 pins: (NB: "Even" and "Odd" below refer to quadword 0 and 1 respectively, i.e. bytes 0-7 and 8-15)

| Signal | Description | Type | Count |
|---|---|---|---|
| RAM_D0-(39:0) | Even Bank DRAM Data | Bidirectional | 40 |
| RAM_D1-(39:0) | Odd Bank DRAM Data | Bidirectional | 40 |
| RAM_ADDR0(9:0) | Even Bank Multiplexed Address | Output | 10 |
| RAM_ADDR1(9:0) | Odd Bank Multiplexed Address | Output | 10 |
| RAS00- | Even Bank Row Address Strobe0 | Tristate | 1 |
| RAS01- | Even Bank Row Address Strobe1 | Tristate | 1 |
| RAS10- | Odd Bank Row Address Strobe0 | Tristate | 1 |
| RAS11- | Odd Bank Row Address Strobe1 | Tristate | 1 |
| CS00- | Even Bank Chip Select0 | Tristate | 1 |
| CS01- | Even Bank Chip Select1 | Tristate | 1 |

| | | | |
|---|---|---|---|
| CS10- | Odd Bank Chip Select0 | Tristate | 1 |
| CS11- | Odd Bank Chip Select1 | Tristate | 1 |
| OE0- | Even Bank Output Enable | Output | 1 |
| OE1- | Odd Bank Output Enable | Output | 1 |
| WCB0- | Even Bank Checkbit Write Enable | Output | 1 |
| WCB1- | Even Bank Checkbit Write Enable | Output | 1 |
| WE0- | Even Bank Write Enable | Output | 1 |
| WE1- | Even Bank Write Enable | Output | 1 |

Configuration for Master/Slave, Even/Odd longword and diagnostic inputs take 3 pins:

| | | | |
|---|---|---|---|
| B_MASTER | Master/Slave Configuration Input | Input | 1 |
| B_DIAG | Diagnostic Mode | Input | 1 |
| B_RC_INH | RAS/CS Inhibit | Input | 1 |

Inter-MBC communication between the Master and Slave MBCs requires 8 pins:

| | | | |
|---|---|---|---|
| B_ECC_STALL_D- | ECC Error Stall Request Out | Output | 1 |
| B_ECC_STALL_R- | ECC Error Stall Request In | Input | 1 |
| BDCD_EB_RC-(1:0) | Even Bank Request Code | Bidirectional | 2 |
| BDCD_OB_RC-(1:0) | Odd Bank Request Code | Bidirectional | 2 |
| BSEL_EVEN- | Select Even Bank | Bidirectional | 1 |
| BSEL_SLV | Select Slave MBC | Bidirectional | 1 |

43 Clock, Scan Control, VCC and ground pins:

| | | | |
|---|---|---|---|
| CLOCKA | clock | Input | 1 |
| CLOCKB | clock | Input | 1 |
| CLOCKC | clock | Input | 1 |
| CLOCKD | clock | Input | 1 |
| A | Scan Control | Input | 1 |
| B | Scan Control | Input | 1 |
| C | Scan Control | Input | 1 |
| D | Scan Control | Input | 1 |
| DI | Scan Control | Input | 1 |
| DO | Scan Control | Output | 1 |
| E | Scan Control | Input | 1 |
| GND | Ground | Input | 20 |
| VCC | +5 Volt Supply | Input | 12 |

3. Memory Control Logic Operation

3.1 Bus Commands

The XBUS spec allows the following bus commands:

> Write
> Write Multiple
> Write Data
>
> Read
> Read Multiple
> Read Response
> Read Response Error
>
> Broadcast Commands
> NOP The following sections examine each command in terms of the operation of the memory. Acknowledgements are sent two bus cycles after the command. The VPN field of XBUS commands is ignored by the memory.

3.1.1 Invalid Commands

The following commands are invalid if directed to the memory. They are not acknowledged and no action is performed by the memory:
> Read Response
> Read Response Error
> Broadcast Commands
> NOP

3.1.2 XBUS Write Command

The valid byte bits are examined by the MBC and, if the transaction is less than a longword write, a read-modify-write cycle is performed and ECC correction is applied if required. Otherwise an early write cycle is used and no ECC checking is done. There is no indication of the completion of the DRAM cycle unless an ECCC or ECCU occurs on a read-modify-write cycle. In such a case, an interrupt is sent to the programmed address. In the case of an ECCU, the write is be aborted.

Write order is always strictly preserved from the instruction stream's point of view. Implementation of write order within a single bank is strictly sequential, but writes to different banks may be performed out of order.

3.1.3 XBUS Write Multiple Command

Write Multiple is acknowledged with "busy" if there is not at least one additional entry free in the module controller's queue for the write data command that follows.

If the target module is idle or becomes idle before the bank and module controller queues become full, then a burst write is initiated and the memory will be able to accept the maximum length transfer. Otherwise a "busy" acknowledgement is be sent when the MMC is completely full.

If the address of the write multiple is not quadword aligned, then the initial odd longword data is contained in the write multiple command.

3.1.4 XBUS Write Data Command

The write data command is the data transfer portion of a write multiple command. If the write multiple is accepted, then there is enough room in the queue for at least one write data command and it is queued and distributed to the bank controllers as they become ready. When one busy acknowledge is sent in a write multiple/write data sequence, all subsequent write data commands are ignored and no acknowledge is sent. A write data command without a preceeding write multiple command from the same commander is also ignored. The write data commands must have the same ID and SUBID field as the write multiple command or they are ignored and no further write data commands are accepted. The write multiple operation terminates with any command other than write data.

3.1.5 XBUS Read and Read Multiple Commands

Read commands have a data phase associated with them which uses the read response command. The XBUS is requested in the cycle prior to data becoming available to minimize latency. When the bus is granted, a read response is sent with the commander's ID and SUBID. Regardless of the address accessed, the data will be aligned on the 64 bit data bus as it is in memory, i.e., byte 0 occupies bits <63:56> and byte 7 occupies bits <7:0>. Data not requested is not guaranteed to be valid.

If the MBC detects a correctable error in the data being transferred, it signals the MMC which replaces the read response command by a NOP. The MMC holds the XBUS and inserts an additional NOP to allow the commander time to back up his cache fill. The data is corrected in the meanwhile and the corrected data is then returned in a read response. If there is time, e.g. due to delay in acquiring the XBUS, then the MBC corrects the data transparently with no interruption in the flow of data on the XBUS. In either case an interrupt is then sent to the CPU programmed in the MMC CSR.

If an uncorrectable error occurs, the same sequence is used except that the two NOPs are followed by a read response error. A response to a read multiple continues to completion despite the error.

The memory will attempt to pass reads in front of writes which do not conflict in address. This will tend to reduce the worst case read and cache fill latency.

The bank controllers will also recognize when sequential commands use the same RAS address and will use static column mode to shorten the cycle time and improve overall memory bandwidth.

4. Memory Performance

Some of the memory performance will be determined by the percentage of the time a request hits a busy bank. If the bank has been cycled recently, it must wait a precharge time (100ns.) before it can be cycled again. This does not apply to burst mode cycles using static column accesses.

4.1 Read Multiple

4.1.1 Latency

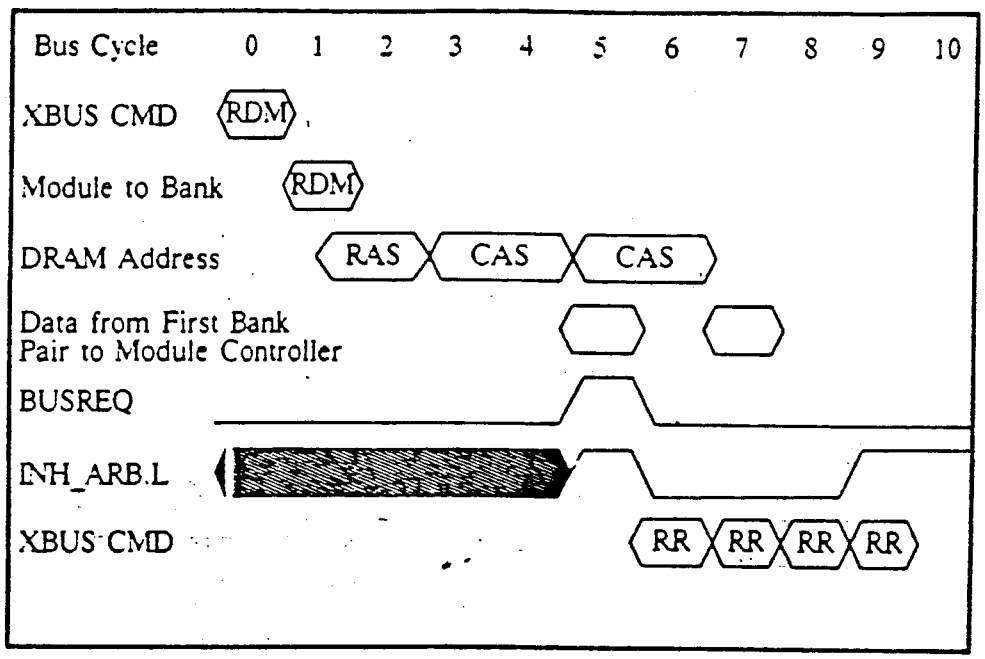

32 Byte Read Response

For a read multiple command to an idle memory, one bus cycle is used to transfer the command over the bus to the module controller. The second cycle is used to check the command, transfer the command to the appropriate bank controllers and acknowledge it. Three more cycles are required for the DRAM RAS access time. In the following cycle the read response is placed on the bus. A best-case total of 300ns. Data availability is anticipated and the bus is requested in advance so that data availability and bus acquisition can coincide.

4.1.2 Bandwidth

For a read multiple, a read response will be issued every 50ns. by ping-ponging between the two bank pairs on a module and using static column cycles. Since 8 bytes are transferred on each read response, once the burst begins, a peak bandwidth of 160MB/sec is maintained.

4.2 Write Multiple

4.2.1 Latency

The latency for executing the first write multiple is similar to that of read multiple except we omit the read response phase. A best-case latency of 300ns.. but only the bus transfer is seen by the commander.

4.2.2 Bandwidth

Write data can be consumed at a rate of 8 bytes per 50ns. yielding a peak bandwidth of 160MB/sec. Ping-ponging and static column cycles are used similar to the case of the read command.

4.3 Read Single

4.3.1 Latency

The latency for a read single will be the same as for a read multiple. Read single commands should be rare for accesses to memory except for lock variables.

4.3.2 Bandwidth

For a read, a read response of up to 4 bytes can be issued every 50ns. from independent banks. The best case bandwidth of 80MB/sec. (longword read) could be sustained if there were no hits in a busy bank (and therefore no precharge time penalty).

4.4 Write Single

4.4.1 Latency

A write single for a longword will have the same latency as a write multiple (300ns.). If the write is smaller than a longword, a read-modify-write cycle must be performed with about a 150ns longer cycle time.

4.4.2 Bandwidth

A write single of 1 to 3 bytes takes 7 clocks to execute with precharge time, but a longword write single takes 5 clocks. If a subsequent write single is issued to the same RAS address in the same bank, then a 1 to 3 byte write takes only 5 additional clocks and a longword write takes only 3 additional clocks.

The resulting bandwidth ranges from 2.9 to 26.7 MB/sec. for a single bank. The independant banks operate in parallel and therefore increase this range linearly.

5. Control and Status Registers

Each memory board has a set of control and status registers, including an error registers and configuration register. Each board's registers start at a base address that is determined by the slot ID as specified in the XBUS specification. All registers are byte writeable.

The module controller contains the board's registers at the beginning of the board's CSR space. The register offsets from the base address are as follows:

|  | MMC0 | MMC1 |
|---|---|---|
| Interrupt Address Register | +0 | +8 |
| Control/Status Register | +4 | +12 |

Bank registers occupy the range of offsets from $20-$3F. Each bank's registers occupy 8 bytes each:

Bank Control/Status Register +0
Bank Error Address Register +4

The upper 128KB (offsets $20000-$3FFFF) of the memory board's CSR space is used for diagnostic access to the ECC check bits. Each byte contains the check bits for one data longword and so the 128KB window covers the check bits for 512KB of data memory.

Use of read multiple to access the memory board's CSR address space is prohibited.

5.1 MMC Control and Status Registers

The CSR block is the location for all software visible state in the MMC. It also contains the multiplexer between read response data from the MBCs and from the MMC CSR. Addressing is described in the XBUS Interface CSR decode section.

When the CSR has an XBUS transaction to send, it requests the Bank Interface to acquire the XBUS. When it does, and when it enables the CSR, the CSR inserts its interrupt or read response and releases its request.

5.1.1 Interrupt Address Register [ +0/+8 ]

This longword contains the 24 bit address of the location to be written when for an ECCU interrupt. It also contains an 6 bit field which, for an ECCC interrupt, is substituted for the least significant 6 bits of the longword address of the ECCU interrupt location.

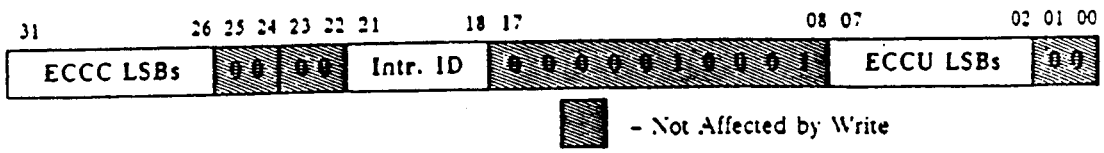

- Not Affected by Write

5.1.2 Control and Status Register [ +4/+12 ]

This register contains summary error information and control for the board.

| 31 30 29 | 24 23 22 21 | 16 15 14 | 08 07 06 05 | 00 |
|---|---|---|---|---|
| U C | UE CE | W | CB Offset | WM |

U = ECCU Latched Status - Write "1" to clear  
C = ECCC Latched Status - Write "1" to clear  
UE = ECCU Interrupt Enable  
CE = ECCC Interrupt Enable W = Check Bit Window Enable -  
WM = Check Bit Window Module ☐ - Reserved; Write with "0"s

Brief Explanation of CSR bits

Latched Status: Set whenever a bank reports the corresponding error. Read/Write 1 to clear.

Interrupt Enables: If the Latched Status Bit is set and the corresponding Interrupt Enable is set, then a write to the appropriate interrupt location is scheduled. When the write is sent, the interrupt enable is cleared.

Check Bit Window Enable: Enables the check bit window.

Check Bit Window Offset: Offsets the data locations covered by the check bit window in steps of 128KB.

Check Bit Window Module: Module to read for check bit window accesses.

5.1.3 Interrupt Service

The anticipated sequence for servicing a memory interrupt is:

1. Read each MMC's CSR's Latched Status bits and see which is(are) interrupting.

2. Clear the interrupting MMC CSR's Latched Status bits.

3. Poll the attached MBCs to see which have errors latched, rewrite the location with the error to remove the error, and clear the MBC's latched error bits.

4. Reenable the interrupts.

5. Reread the interrupting MMC CSR's Latched Status bits to see if another error has occurred during the service routine.

5.2 MBC Control and Status Registers

There are two registers associated with a Bank Controller, the Control and Status Register (CSR) and the Error Address Register (EAR). Each set of registers is shared between two bank controllers to economize on hardware. Banks 0 and 2 share one set, and banks 1 and 3 share the other. The CSRs are only writeable through banks 0 and 1, but are readable through either address.

5.2.1 Bank Controller Control and Status Register

Each bank controller contains a CSR to control diagnostic and ECC modes.

```
31 30 29 28 27              16 15 14 13 13 13 10 09 08 07                00
┌─┬─┬─┬─┬────────┬──────────┬────┬─┬─┬─┬─┬─┬──────────────────┐
│E│U│M│C│        │ Error ID │SUB-│D│W│R│L│F│   Syndrome(7:0)  │
│ │ │ │ │        │          │ ID │ │ │ │ │ │                  │
└─┴─┴─┴─┴────────┴──────────┴────┴─┴─┴─┴─┴─┴──────────────────┘
```

E = Error Latched (Write "1" to clear)    D = Diagnostic Mode
U = ECCU                                   W = Diagnostic Write All Quadrants
M = Multiple ECCUs                         R = Raw Mode (ECC Disable on Read)
C = Diagnostic Compare Error               L = Lock Compare Register
                                           F = Freeze Check Bits

 - Not Affected by Write      - Reserved; Write with "0"s

Brief Explanation of CSR Bits

E  Error Latched. Whenever any ECC or Diagnostic Compare Error is encountered, this bit is set to indicate that the Error Address Register and the read-only fields of the CSR are valid. Write a "1" to clear this flag.

U  Set if latched error is an ECCU. If not set then the latched error is an ECCC or Diagnostic Compare Error. If an ECCU occurs while either an ECCC or a Diagnostic Compare Error is latched, the ECCU information will overwrite the latched information. Read Only.

M  Set if multiple ECCU errors have occurred. The latched information is for the first ECCU that occurred. Read Only.

C  Set if a Diagnostic Compare Error has occurred. This error is only enabled if the D bit or the L bit is set.

D  Diagnostic Compare Mode. Operation of diagnostic mode requires one master module to have the bit reset. All modules which have this bit set will be slaved to the master. Slaves will accept all write and read command regardless of module destination. No data will be presented by the slave to the MMC, but instead it will compare the internal data to the Master's data. Mismatches will result in a diagnostic compare error.

W  Diagnostic Write All Quadrants Mode. Normally a write to the RAM array of a bank only affects 10 of the 40 DRAMs. The 10 are selected by the RAS and CS select bits (see the EAR description below). When the W bit is set, the RS and CS bits of the address are ignored and all 40 DRAMs are written. This reduces the time to write the RAM array by a factor of 4.

R  Raw Mode. ECC checking is disabled on read and read-modify-write cycles. Correct check bits are generated on write and read-modify-write cycles.

L   Lock Compare Register. The compare register, used in diagnostic mode above, can be frozen to check blocks of Master or single board memory. With this bit reset, a read will load the compare register. Setting the bit will lock the register and any subsequent read with different data will cause a diagnostic compare error.

F   Freeze Check Bits. Used for creating ECC errors in memory. When set, write or read-modify-write operations cause data to be updated in memory, but not checkbits. Whatever checkbits exist in a location remain unchanged.

Error ID, SUBID

The slot ID and command SUBID of the XBUS device which issued the failing command.

Syndrome

8 Bit Syndrome of the ECC error.

5.2.2 Error Address Register (EAR)

The Error Address Register is read-only. It is frozen at the same time the CSR on ECC errors. Only 22 bits of double-quadword address are captured. The high order 4 bits must be obtained for each module from the configuration table supplied by the Service Processor at boot time. Mapping of physical address to DRAM address is shown for diagnostic purposes.

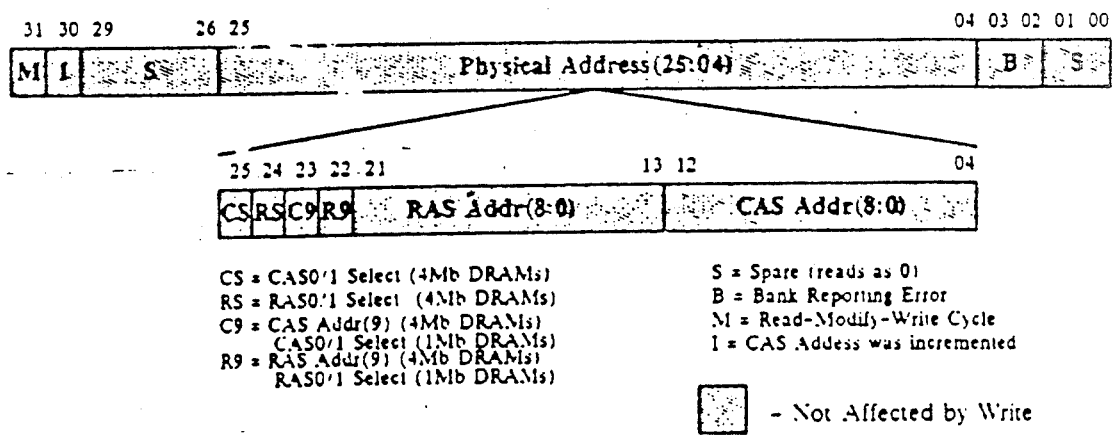

CS = CAS0/1 Select (4Mb DRAMs)
RS = RAS0/1 Select (4Mb DRAMs)
C9 = CAS Addr(9) (4Mb DRAMs)
    CAS0/1 Select (1Mb DRAMs)
R9 = RAS Addr(9) (4Mb DRAMs)
    RAS0/1 Select (1Mb DRAMs)

S = Spare (reads as 0)
B = Bank Reporting Error
M = Read-Modify-Write Cycle
I = CAS Address was incremented ☐ — Not Affected by Write

Brief Explanation of EAR Status Bits

M   Latched information is for a Read-Modify-Write cycle, i.e., a write of less than ·· bytes.

I   Set if the latched CS address has been advanced 16 bytes beyond the failing location. This may happen on read multiple operations since the address is pipelined.

B   Set to indicate which bank has reported the error.
NB: since banks 0 and 2 share one register and banks 1 and 3 share another, the least significant bit is scan-initialized and static, not dynamic.

6. Error Handling

6.1 Correctable Errors

A correctable error may occur whenever data is read from the DRAM's. This can happen during a read response or a write request which is less than a longword.

On a read response, the read response is changed to a sequence of two NOPs, the data is corrected and supplied in the subsequent bus cycle. An error indication is flagged to the module controller which will, in turn, cause an interrupt by writing to the address specified in the interrupt address register. The error information is frozen in the bank CSR and error address register. Until the ECCC bit is turned off in the bank CSR, any subsequent single bit error will be corrected, but will not be reported.

On a write request of less than a longword, the data is corrected and merged with the bytes to be written. The new longword is written into memory. The status register is frozen and the interrupt is generated. Any subsequent errors that occur while the interrupt is pending are treated the same as the read case.

6.2 Uncorrectable Errors

An uncorrectable error may occur under the same circumstances as a correctable error.

Uncorrectable errors are handled in the same way a correctable errors except that corrected data cannot be supplied. so the read response is terminated by issuing a read response error command after the two NOPs. Write cycles encountering uncorrectable errors are aborted without the write being performed. Information on the error is loaded into the MBC CSR and error address registers and frozen. An interrupt is generated by the MMC to the address specified in the interrupt address register.

While the register has the uncorrectable error information latched, any subsequent correctable errors will be corrected but no information will be logged in the status register. If an uncorrectable error occurs, no information is logged on the second ECCU except the Multiple Errors bit will be set.

If an uncorrectable error occurs while the register has information latched for a correctable error, the ECCU Error bit is set in the CSR and the ECCU information overwrites the ECCC data. This is the only sequence of events that will set both the ECCC Error and ECCU Error bits in the CSR and the information in the CSR will pertain to the ECCU Error.

7. Diagnostic Features

7.1 Diagnostic Mode

When a module is in diagnostic mode, it becomes a slave to the other module attached to the MMC. Operations are performed in parallel with the master and any read response data issued by the master is latched and checked against the data that the slave would have supplied. If the data does not match, the slave generates an ECCU indication to the MMC and logs the mismatch in its CSR.

7.2 Write All Quadrants

The DRAMs associated with a bank are divided into four quadrants addressed by two RAS and two CS lines. Normally operations (except for refresh) are performed on only 1 of the quadrants at a time. When an MBC is in write all quadrants mode, all four quadrants are written simultaneously.

7.3 Raw Mode

In raw mode, ECC errors will not be checked or reported. This provides a mechanism for reading data from a location with an uncorrectable error.

7.4 Lock Compare Register

The compare register used by the slave in diagnostic mode can be enabled by this mechanism in any module. Once locked, the data from the previous read response stays in the register. If any subsequent read response mismatches, the compare error flag is set in the MBC CSR and an ECCU error is reported to the MMC.

7.5 Freeze Check Bits

When this bit is set, writes to the DRAMs do not update the checkbits. This provides a mechanism for creating ECCC and ECCU errors in the memory.

7.6 Reading the Check Bit RAMs

The check bit window is used to read the check bit RAMs. The offset of the window must be set in the MMC CSR and the window enabled first. Read commands are allowed up to a longword in length, but read multiple is not allowed in the check bit window. Each successive byte in the checkbit window corresponds to the check bits for the corresponding data longword. ECC errors are not be checked on reads through the window.

8. Reliability

The MTBF goal for the memory subsystem should be well in excess of 10,000 hours. Note that the minimum acceptable system MTBF should be well in excess of 2,000 hours.

See Appendix A for subsystem MTBF estimate calculations. The calculations estimate that the MTBF of each motherboard is in excess of 52,000 hours, so, even with three motherboards installed, a memory system MTBF of 17,000 hours may be estimated.

8.1 MOS DRAM MTBF

The MOS RAM's are static column, 100ns access time, with 256Kx4 and 1Mx4 organizations. The hard failure rate is estimated to be < 150 FIT (Failures In Time) (0.15 hard failures per million device hours). The estimated soft failure rate is < 300 FIT.

9. Power

Only 1/4 of the DRAMs in each bank can cycle simultaneously (except for diagnostic mode). Each DRAM is capable of dissipating 300mW when active and 20mW in standby. A continuously active module has 40 DRAMs active which dissipate 12W. Idle modules dissipate about 4W. If we assume that only two modules can be kept continuously active then the DRAM dissipation is 32W for a fully populated motherboard. The gate arrays, CMOS DRAM address and RAS/CS drivers should account for no more than another 15W. If we allot another 5W for the XBUS drivers, the total for a fully populated motherboard is about 52W.

Appendix A

A. DRAM MTBF Calculations

The system MTBF goal should be well above 2000 hours. Therefore all major subassemblies should have MTBF values well above that. In particular the memory subsystem should have an MTBF of at about 10,000 - 20,000 hours. The number presented below are for a single 64MB memory motherboard. If the system uses 128MB then the failure rates are doubled.

A.1 RAM Failure Model

Soft errors are modeled as a Poisson process. The probability density function for the occurrence of a "n" errors is $$p(n,t) = \lambda^n t^{n-1} e^{-\lambda t}$$

where $\lambda$ is the failure rate. The probability function is simply the integral of the probability density function.

The estimated maximum soft error rate ($\lambda_s$) is 0.3 errors per million device hours (300 FIT). A fully configured memory board of 64MB will have 640 DRAM devices on it. The overall soft error rate for the board without error correction is therefore 192 errors per million device hours or an MTBF of about 5200 hours. This would be unacceptable without error correcting codes.

The estimated maximum hard error rate ($\lambda_H$) is 0.15 errors per million device hours. The overall hard error rate for a 64MB board would be 96 errors per million hours or an MTBF of about 10,400 hours. Note that there are several hard error mechanisms: complete failure of a chip, failure of a row, failure of a column and failure of a single cell. The calculations based on hard errors assume that it is always a complete failure of a chip and so are more pessimistic than reality.

A.2 Effect of Error Correcting Codes on Soft Error Rate

Use of a SECDED (single error correct, double error detect) code means that only multiple bit errors in the same longword produce system failures. Even if soft errors are not corrected in memory and we assume that the errors are distributed uniformly across the memory, the probability that two soft errors will occur in the same longword is $$P(ECCU) = \left( \lambda_s t \frac{40}{10 \cdot 64MB} (\lambda_s t - 1) \frac{39}{10 \cdot 64MB} \right) \frac{64MB}{2 \cdot 4}$$

So, to reach even a probablity of 10%, takes about 1800 times the single bit error MBTF, or about 9 million hours.

- 32 -

A.3 RAM Hard Errors

256Kx4 DRAMs are used in this memory. The most prevalent failure modes affect only a single cell, but perhaps 20% of the hard errors in a 256Kx4 DRAM affect more than one output. These errors cause ECCU errors with no warning and no opportunity for page retirement. With the total hard error MTBF of 10,400 hours, the MTBF for a hard error induced ECCU is, then, approximately 52,000. This is an acceptable per motherboard MTBF.

Note that normally the failure of an entire 256Kx4 DRAM could cause 3 and 4 bit errors. The standard seven check bits would not guarantee detecting these errors and they could be interpreted as no error or a correctable, single-bit error. The addition of an eighth check bit allows the guarantee that any 3 or 4 bit error as the result of a single DRAM failure will be correctly identified as an ECCU.

Appendix B

B. ECC Parity Algorithm

B.1 ECC Parity Matrix

| Data bit | Check word bit | | | | | | |
|---|---|---|---|---|---|---|---|
| | 6 | 5 | 4 | 3 | 2 | 1 | 0 |
| 31 | 1 | 1 | 1 | 0 | 1 | 0 | 1 |
| 30 | 1 | 1 | 1 | 0 | 0 | 0 | 0 |
| 29 | 1 | 1 | 0 | 1 | 1 | 0 | 1 |
| 28 | 1 | 1 | 0 | 1 | 0 | 1 | 1 |
| 27 | 1 | 1 | 0 | 1 | 0 | 0 | 0 |
| 26 | 1 | 1 | 0 | 0 | 1 | 1 | 1 |
| 25 | 1 | 1 | 0 | 0 | 1 | 0 | 0 |
| 24 | 1 | 1 | 0 | 0 | 0 | 1 | 0 |
| 23 | 0 | 0 | 1 | 1 | 1 | 0 | 0 |
| 22 | 0 | 0 | 1 | 1 | 0 | 1 | 0 |
| 21 | 0 | 0 | 1 | 1 | 0 | 0 | 1 |
| 20 | 0 | 0 | 1 | 0 | 1 | 1 | 0 |
| 19 | 0 | 0 | 1 | 0 | 1 | 0 | 1 |
| 18 | 0 | 0 | 1 | 0 | 0 | 1 | 1 |
| 17 | 0 | 0 | 0 | 1 | 0 | 1 | 1 |
| 16 | 0 | 0 | 0 | 1 | 1 | 1 | 0 |
| 15 | 0 | 1 | 1 | 0 | 1 | 0 | 0 |
| 14 | 0 | 1 | 1 | 0 | 0 | 0 | 1 |
| 13 | 0 | 1 | 0 | 1 | 1 | 0 | 0 |
| 12 | 0 | 1 | 0 | 1 | 0 | 1 | 0 |
| 11 | 0 | 1 | 0 | 1 | 0 | 0 | 1 |
| 10 | 0 | 1 | 0 | 0 | 1 | 1 | 0 |
| 09 | 0 | 1 | 0 | 0 | 1 | 0 | 1 |
| 08 | 0 | 1 | 0 | 0 | 0 | 1 | 1 |
| 07 | 1 | 0 | 1 | 1 | 1 | 0 | 1 |
| 06 | 1 | 0 | 1 | 1 | 0 | 1 | 1 |
| 05 | 1 | 0 | 1 | 1 | 0 | 0 | 0 |
| 04 | 1 | 0 | 1 | 0 | 1 | 1 | 1 |
| 03 | 1 | 0 | 1 | 0 | 1 | 0 | 0 |
| 02 | 1 | 0 | 1 | 0 | 0 | 1 | 0 |
| 01 | 1 | 0 | 0 | 1 | 0 | 1 | 0 |
| 00 | 1 | 0 | 0 | 1 | 1 | 1 | 1 |

B.2 256Kx4 DRAM Bit to Device Assignment

B.2.1 Data Bit Assignment

| Data bit | Device | Bit |
|----------|--------|-----|
| 31 | 0 | 0 |
| 30 | 1 | 0 |
| 29 | 2 | 0 |
| 28 | 3 | 0 |
| 27 | 0 | 1 |
| 26 | 1 | 1 |
| 25 | 2 | 1 |
| 24 | 3 | 1 |
| 23 | 0 | 2 |
| 22 | 1 | 2 |
| 21 | 2 | 2 |
| 20 | 3 | 2 |
| 19 | 0 | 3 |
| 18 | 1 | 3 |
| 17 | 2 | 3 |
| 16 | 3 | 3 |
| 15 | 4 | 0 |
| 14 | 5 | 0 |
| 13 | 6 | 0 |
| 12 | 7 | 0 |
| 11 | 4 | 1 |
| 10 | 5 | 1 |
| 09 | 6 | 1 |
| 08 | 7 | 1 |
| 07 | 4 | 2 |
| 06 | 5 | 2 |
| 05 | 6 | 2 |
| 04 | 7 | 2 |
| 03 | 4 | 3 |
| 02 | 5 | 3 |
| 01 | 6 | 3 |
| 00 | 7 | 3 |

B.2.2 Check Bit Assignment

Bit 7 is assigned as an additional parity bit on the check bits with 256Kx4 DRAMs:

| Check bit | Device | Bit |
|---|---|---|
| 7 | 9 | 3 |
| 6 | 8 | 0 |
| 5 | 8 | 1 |
| 4 | 8 | 2 |
| 3 | 8 | 3 |
| 2 | 9 | 0 |
| 1 | 9 | 1 |
| 0 | 9 | 2 |

What is claimed is:

1. A fast memory system, comprising
a static column dynamic random access memory (DRAM);
a command queue for receiving memory commands and providing DRAM address signals in response to said memory commands;
a RAM control means for receiving said DRAM address signals and issuing DRAM control signals to said DRAM; and
address compare means for comparing successive DRAM address signals and providing a RAM control signal to said RAM control mans when a select portion of said DRAM address signals are equal, wherein
the RAM control signal is asserted for a new command without providing a different subsequent row address signal.

2. The fast memory system of claim 1, wherein said RAM control means further includes means for deasserting the write (W) and chip select (CS) before said write (W) and chip select (CS) signals are reasserted for a subsequent write command having a row address corresponding to the row address of the previous command.

3. A method of high speed static column dynamic random access memory data transfer, comprising the steps of:
issuing a first read command for writing data into said DRAM for data having a first address comprising a plurality of signals;
issuing a second read command for reading data from said DRAM for data having a second address comprising a plurality of signals; and
comparing said first and second address;
starting said second read operation associated with said read command before said first read operation associated with said write command when the data provided by said DRAM in response to said read operation does not affect said first read operation and when said first and second addresses share at least a common portion of said address signals.

4. A method a high speed static column dynamic random access memory data transfer, comprising the steps of:
entering a plurality of commands into a queue including a respective plurality of queue locations, said plurality of commands each including a row address select field;
advancing each of said plurality of commands from each of said respective plurality of queue locations to a respective plurality of next queue locations and toward a next command to be executed location, for subsequent execution by a memory control means including a state machine;
comparing said row address select field of a current command being executed, with said row address select field of a next command to be executed to generate a result;
outputting said result to said memory control means;
affecting a sequence of execution of said state machine in accordance with said result; and
performing memory operations in accordance with control signals generated by said memory control means in response to said sequence of execution of said state machine.

5. The method of claim 4 further including the step of:
multiplexing a plurality of addresses to said dynamic random access memory in accordance with said sequence of execution of said state machine.

6. The method of claim 4 wherein said plurality of commands include read, write and read-modify-write commands.

7. The method of claim 4 further including the steps of:
selecting a read command in said queue that is closest to said next command to be executed location;
sequencing through a plurality of write commands in said queue and comparing said row address select field of each of said plurality of write commands with said row address select field of said read command;
waiting until a write command which has been in said queue longer than said read command and having the same row address select field as said read command, is executed;
promoting said read command to said next command to executed location when there is a current command being executed; and
promoting said read command to said current command being executed, 8. The method of claim 4 wherein said step of affecting a sequence of execution of said state machine involves branching back in said sequence to a column address select state when data is available to perform a memory operation and said row address select field of said current command being executed is the same as said row address select field of said next command to be executed.

9. The method of claim 8 wherein a chip select control signal and a write command control signal are deasserted prior to branching back in said sequence to said column address select state, when said current command being executed is a read command and said next command to be executed is a write command.

* * * * *

UNITED STATES PATENT AND TRADEMARK OFFICE
CERTIFICATE OF CORRECTION

PATENT NO. : 5,022,004
DATED : June 4, 1991
INVENTOR(S) : Jeffrey D. Kurtze, et al.

It is certified that error appears in the above-identified patent and that said Letters Patent is hereby corrected as shown below:

Column 2, line 8, "application" should read --applications--.

Column 3, line 11, "provided" should read --provides--.

Column 61, line 13, "mans" should read --means--.

Signed and Sealed this

Seventeenth Day of August, 1993

Attest:

BRUCE LEHMAN

Attesting Officer        Commissioner of Patents and Trademarks